Figure 2:
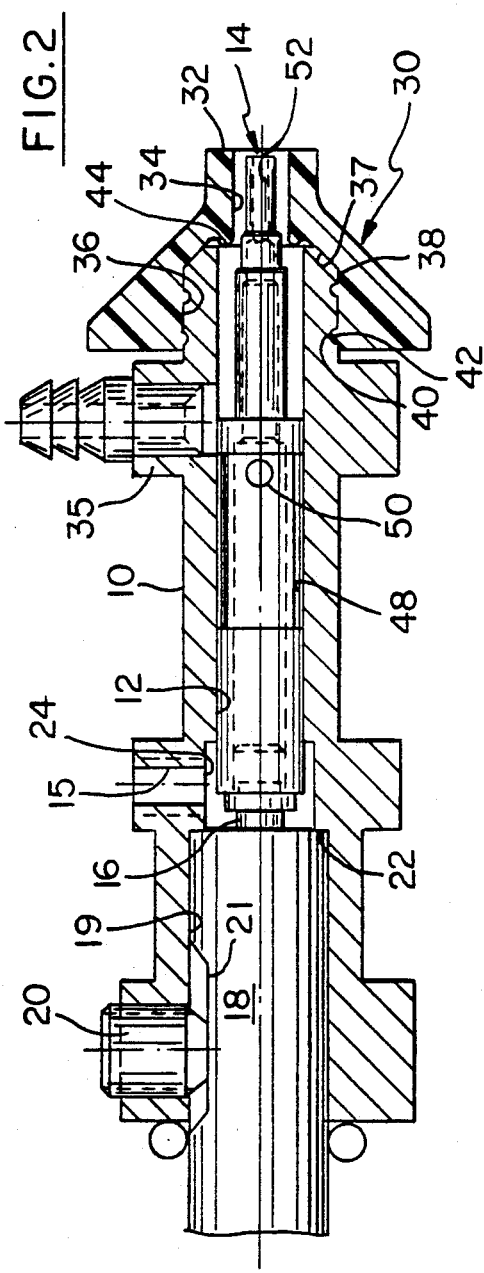

United States Patent [19]
Jackson et al.

[11] Patent Number: 5,113,578
[45] Date of Patent: May 19, 1992

[54] TOOL TIP ASSEMBLY FOR SURFACE MOUNT MACHINE

[75] Inventors: Rodney P. Jackson, Auburn, N.H.; Mark E. Rossmeisl, Beverly, Mass.

[73] Assignee: Emhart Inc., Newark, Del.

[21] Appl. No.: 620,147

[22] Filed: Nov. 29, 1990

[51] Int. Cl.⁵ .................... H05K 13/04; B25J 15/06
[52] U.S. Cl. .................................. 29/743; 294/64.1
[58] Field of Search ............ 29/740, 743, 741, 33 M; 279/3; 294/64.1, 2, 64.2; 901/40; 414/627, 737, 752

[56] References Cited

U.S. PATENT DOCUMENTS

| | | | |
|---|---|---|---|
| 4,703,965 | 11/1987 | Lee et al. | 294/64.1 |
| 4,728,135 | 3/1988 | Sugimura et al. | 294/64.1 |
| 4,762,354 | 8/1988 | Gfeller et al. | 29/743 |
| 4,852,247 | 8/1989 | Hawkswell | 29/740 |
| 4,887,351 | 12/1989 | Porterfield et al. | 29/740 |
| 4,917,568 | 4/1990 | Hawkswell | 294/64.1 X |

FOREIGN PATENT DOCUMENTS

63-9953  3/1988  Japan ................. 294/64.1

*Primary Examiner*—William Briggs
*Attorney, Agent, or Firm*—Spencer T. Smith

[57] ABSTRACT

The tool tip assembly has a fixed large tool tip and a movable telescoping tool tip which has a smaller area pick-up end. The telescoping tool tip is displaceable between fixed stops and the forward stop is defined by an annular bumper projecting rearwardly from the inner surface of the fixed tool tip proximate the forward bore portion. The telescoping tool tip can be quickly and conveniently accessed for repair, inspection or replacement by removing the molded elastomeric fixed large tool tip.

2 Claims, 1 Drawing Sheet

TOOL TIP ASSEMBLY FOR SURFACE MOUNT MACHINE

The present invention relates to machines for placing surface mount electronic components on circuit boards.

In such machines, a tool tip is brought into engagement with an electronic component to be placed on a circuit board and a vacuum is applied to hold the component on the tool tip. Since the tool tip with the held component may be rapidly displaced from the pick up location to the deposit location, the component must be securely held and this means that larger components should be engaged by tool tips having larger areas so that a larger force can be applied. This may be achieved with the use of a telescoping tool tip which can alternately present small and large area tool tips with the inner tool tip being displaceable between fixed stops to define advanced (pick-up) and retracted (inactive) positions. These stops have conventionally been defined within the tool housing. Repair or replacement required a disassembly of the tool housing and this was very time consuming.

It is accordingly an object of the present invention to provide a telescoping tool tip which can be quickly accessed for repair or replacement.

Other objects and advantages of the present invention will become apparent from the following portion of this specification and from the accompanying drawings which illustrates in accordance with the mandate of the patent statutes a presently preferred embodiment incorporating the principles of the invention.

Figure 1:
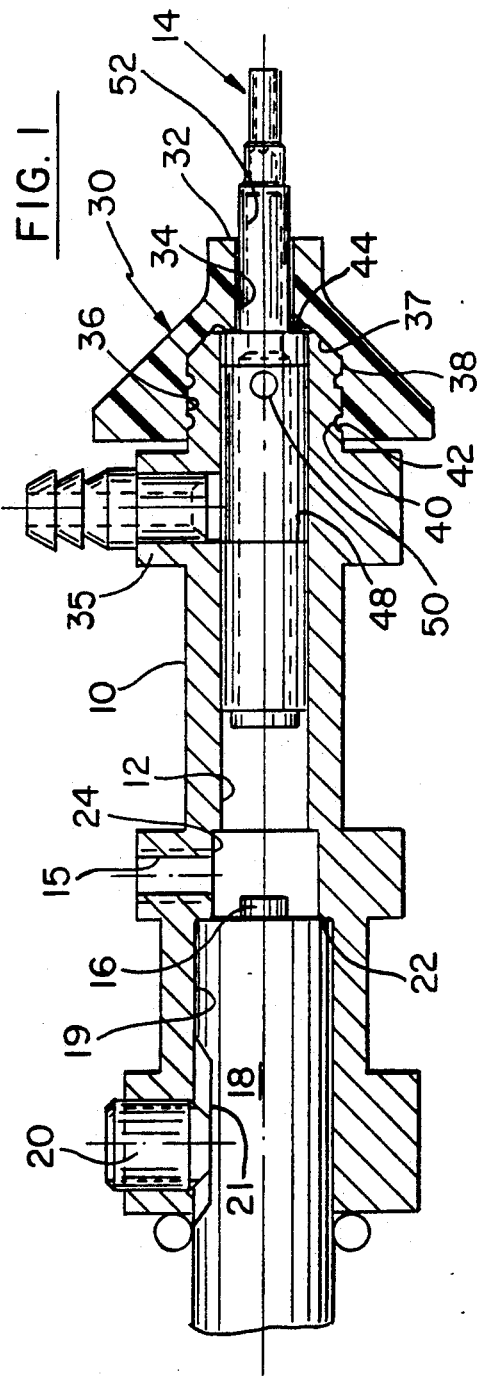

Referring the drawings:

FIG. 1 is a side cross-sectional view of a tool tip assembly for a machine for mounting surface mount electronic components in one of two alternate operating conditions, and FIG. 2 is a similar view illustrating the alternate position.

The tool tip assembly has a housing 10 having an interior bore 12 for receiving an inner tool tip 14. When this inner tool tip 14 is not in use, it will be pulled rearwardly by vacuum applied to a rearward air connection 15 until it stops against a fixed stop 16 which is part of a pin member 18. The pin member 18 is axially received by a second coaxial housing bore 19 and is secured by a set screw 20. The pin member 18 has an elongated flat 21 so that the location of the pin member and hence the stop can be seated against shoulder 22.

A molded elastomeric outer tool tip 30 having a component engaging surface 32 has a first bore 34 communicating with this surface and having a size sufficient to assure that large components will be picked up when the inner tool tip 14 is fully retracted against the stop 16 and vacuum is applied via a forward housing air connection 35. A second enlarged coaxial bore 36 extending into the rear of the outer tool tip is located around the cylindrical end portion 38 of the housing and the outer tool tip is removably held in place by a pair of annular housing groves 40 which receive a pair of annular ridges 42 defined on the inner surface of this bore 36.

The inner surface of the outer tool tip flares outwardly 37 from the first bore 34 to the second bore 36 and an annular, rearwardly facing bumper 44 is defined at the rear end of the first bore. This bumper 44 functions as the forward stop for the inner tool tip and also functions to effectively seal the outer tool tip when the inner tool tip has been pushed forwardly by air under pressure admitted through the rear air connection 15. To pick up a smaller component on the advanced inner tool tip 14, vacuum is applied via the forward connection 35 into the volume 48 surrounding the inner tool tip and through a passage 50 in the inner tool tip into an axial bore 52 which communicates with the end of the inner tool tip.

The inner and outer tool tips can be quickly replaced by simply pulling the outer tool tip off of the housing.

We claim:

1. A tool tip assembly for a machine for mounting electronic components comprising
   a fixed tool having coaxial front and enlarged rear bores,
   a housing having a cylindrical forward portion and a bore extending rearwardly from the front thereof,
   means for removably securing said fixed tool on said cylindrical housing portion with said cylindrical forward housing portion in said enlarged rear tool bore,
   a displaceable tool having a rear cylindrical portion slidably received within said housing bore and a reduced diameter cylindrical forward portion,
   means for stopping the rearward displacement of said displaceable tool at a selected rear position and
   said fixed tool including rearwardly projecting annular bumper means for engaging and stopping the forward displacement of said rear cylindrical housing portion of said displaceable tool at a selected forward position so that when said fixed tool is removed the displaceable tool can be removed from said housing.

2. A tool tip assembly for a machine for mounting electronic components according to claim 1, wherein said fixed tool is made of elastomeric material.

* * * * *